US010305033B2

(12) United States Patent
Chang

(10) Patent No.: US 10,305,033 B2
(45) Date of Patent: May 28, 2019

(54) RESISTIVE RANDOM ACCESS MEMORY

(71) Applicant: Winbond Electronics Corp., Taichung (TW)

(72) Inventor: Shuo-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 205 days.

(21) Appl. No.: 14/830,742

(22) Filed: Aug. 20, 2015

(65) Prior Publication Data

US 2016/0087198 A1    Mar. 24, 2016

(30) Foreign Application Priority Data

Sep. 19, 2014   (TW) .............................. 103132461 A

(51) Int. Cl.
*H01L 45/00*   (2006.01)

(52) U.S. Cl.
CPC .......... *H01L 45/1253* (2013.01); *H01L 45/08* (2013.01); *H01L 45/1233* (2013.01); *H01L 45/146* (2013.01)

(58) Field of Classification Search
CPC . G11C 13/00; G11C 13/0007; H01L 51/5088; H01L 29/452; H01L 27/12; H01L 45/1253; H01L 45/08
See application file for complete search history.

(56) References Cited

U.S. PATENT DOCUMENTS

| 7,183,707 | B2 * | 2/2007 | Tyan | ................... H01L 51/5088 |
| | | | | 313/504 |
| 7,417,271 | B2 | 8/2008 | Genrikh et al. | |
| 8,043,926 | B2 | 10/2011 | Cho et al. | |
| 8,426,841 | B2 | 4/2013 | Seo et al. | |
| 8,665,631 | B2 | 3/2014 | Huo et al. | |
| 2004/0245557 | A1 * | 12/2004 | Seo | .................... G11C 13/0007 |
| | | | | 257/298 |
| 2005/0006653 | A1 * | 1/2005 | Kwak | ................... H01L 29/452 |
| | | | | 257/79 |
| 2006/0108625 | A1 * | 5/2006 | Lee | ........................ G11C 13/00 |
| | | | | 257/310 |
| 2010/0065803 | A1 * | 3/2010 | Choi | ....................... H01L 45/10 |
| | | | | 257/4 |
| 2012/0132882 | A1 * | 5/2012 | Seo | ......................... H01L 27/12 |
| | | | | 257/4 |

(Continued)

FOREIGN PATENT DOCUMENTS

CN        101794807        8/2010
CN        102282673        12/2011

(Continued)

OTHER PUBLICATIONS

"Office Action of China Counterpart Application," dated Nov. 28, 2017, p. 1-p. 8.

*Primary Examiner* — Marc Anthony Armand
(74) *Attorney, Agent, or Firm* — JCIPRNET

(57) ABSTRACT

A resistive random access memory (RRAM) includes a top electrode (TE), a bottom electrode (BE), and a transition metal oxide (TMO) layer between the top and the bottom electrodes. The RRAM further includes a metal cap layer above the top electrode and a transparent metal oxide (TCO) layer between the metal cap layer and the top electrode.

8 Claims, 3 Drawing Sheets

(56) References Cited

U.S. PATENT DOCUMENTS

2012/0281452 A1* 11/2012 Huo .................... H01L 27/2409
                                                                    365/148
2013/0075839 A1* 3/2013 Chen ....................... H01L 43/08
                                                                    257/421
2014/0264222 A1    9/2014 Yang et al.

FOREIGN PATENT DOCUMENTS

| TW | I357149 | 1/2012 |
| TW | I397152 | 5/2013 |
| TW | I434407 | 4/2014 |

* cited by examiner

RESISTIVE RANDOM ACCESS MEMORY

CROSS-REFERENCE TO RELATED APPLICATION

This application claims the priority benefit of Taiwan application no. 103132461, filed on Sep. 19, 2014. The entirety of the above-mentioned patent application is hereby incorporated by reference herein and made a part of this specification.

BACKGROUND OF THE INVENTION

Field of the Invention

The invention is related to a resistive random access memory (RRAM), and particularly related to an RRAM having a transparent conductive oxide layer.

Description of Related Art

In general, an RRAM includes a top electrode (TE), a bottom electrode (BE) and a transition metal oxide (TMO) between the TE and BE, and may be connected to the outside via a top wire and a bottom wire. Since the conductive path in the RRAM is controlled by means of oxygen vacancies under a low resistance state (LRS), the oxygen ions diffusion that is easily affected by temperature difference is the key factor in controlling thermostability of the RRAM. For example, it is often hard to retain a Ti/HfO$_2$ type RRAM currently employed in LRS under high temperature, leading to deterioration in the so-called "high-temperature data retention" (HTDR).

Therefore, there have been a variety of techniques for reducing diffusion of the oxygen ions into the TMO, such as increasing a Set power, which, however, affects the yield for Reset. Moreover, there is a technique of using an extremely thin insulating oxide between the electrodes and the TMO to block the diffusion of the oxygen ions, but it may impact on the conductivity of the memory as a whole and also requires accurate process control.

SUMMARY OF THE INVENTION

A resistive random access memory (RRAM) is provided to inhibit oxygen ions diffusion and has conductivity.

Another RRAM is further provided to inhibit oxygen ions diffusion and achieve transparent conductivity.

One of exemplary embodiments comprises a RRAM including a top electrode (TE), a bottom electrode (BE) and a transition metal oxide (TMO) layer between the TE and BE. The RRAM further includes a metal cap layer above the TE and a transparent conductive oxide (TCO) layer between the metal cap layer and the TE.

According to an exemplary embodiment, the thickness of the TCO layer ranges from 0.5 nm to 50 nm.

Another of exemplary embodiments comprises RRAM including a TE, a BE and a TMO layer between the TE and BE as well as a metal cap layer disposed on the TE and directly contacts the same.

According to respective exemplary embodiments, the thickness of the TCO layer is from 0.5 nm to 250 nm.

According to respective exemplary embodiments, the material of the TCO layer includes Indium-Tin Oxide (ITO), Indium-Zinc Oxide (IZO), Indium-Gallium-Zinc Oxide (IGZO), Fluorine-Tin Oxide (FTO), Aluminum-Zinc Oxide (AZO) or Indium-Calcium Oxide (ICO).

According to respective exemplary embodiments, the material of the BE includes metal, alloy or transparent conductive oxide.

According to respective exemplary embodiments, the RRAM further includes another TCO layer disposed between the BE and the TMO layer. The material of the TCO layer includes ITO, IZO, IGZO, FTO, AZO or ICO.

Based on the above, the TCO layer is disposed above the TE according to the invention, and thus oxygen ions diffusion may be inhibited and the property of conductivity may be accomplished. Meanwhile, under the circumstances where the thickness of the TCO layer is appropriately controlled, the light transmittance may be improved such that the RRAM can perform UV erase operation.

In order to make the aforementioned features and advantages of the invention more comprehensible, embodiments accompanying figures are described in detail below.

DESCRIPTION OF EMBODIMENTS

Figure 1:
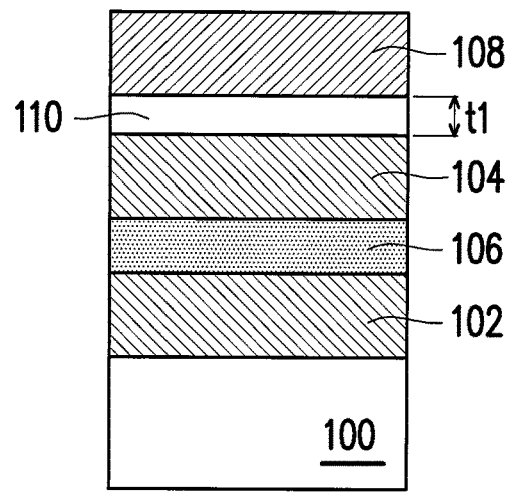
FIG. 1 is a sectional schematic view illustrating an RRAM according to a first embodiment of the invention.

The concept of the invention may be more sufficiently understood with reference to the drawings that show the embodiments of the invention. However, the invention may be realized in many different forms and should not be explained to be limited to the embodiments described below. In fact, the embodiments provided below serve merely to elaborate the invention more completely and in detail, and to fully convey the scope of the invention to persons having ordinary skills in the art.

In the drawings, the size and relative size of each layer and area may be illustrated in exaggeration for the sake of clarity.

FIG. 1 is a sectional schematic view illustrating a resistive random access memory (RRAM) according to a first embodiment of the invention.

In FIG. 1, the RRAM on a substrate 100 includes a bottom electrode (BE) 102, a top electrode (TE) 104 and a transition metal oxide (TMO) layer 106 between the TE 104 and BE 102. A metal cap layer 108 is disposed above the TE 104, and a transparent conductive oxide (TCO) layer 110 is disposed between the metal cap layer 108 and the TE 104 for inhibiting oxygen ions diffusion. Meanwhile, since the material of the TCO layer 110 includes Indium-Tin Oxide (ITO), Indium-Zinc Oxide (IZO), Indium-Gallium-Zinc Oxide (IGZO), Fluorine-Tin Oxide (FTO), Aluminum-Zinc Oxide (AZO) and Indium-Calcium Oxide (ICO) which are transparent and have conductivity, the TCO layer 110 can ensure electrical conductance while blocking oxygen ions diffusion. The thickness t1 of the TCO layer 110 is, for example, from 0.5 nm to 50 nm. The material of the BE 102 and TE 104 includes, for example, metal or alloy. For instances, the material of the BE 102 and TE 104 may be independently selected from a group consisting of at least one of Ti, Ta, Ni, Cu, W, Hf, Zr, Nb, Y, Zn, Co, Al, Si, Ge and the alloy thereof. The material of the metal cap layer 108 includes, for example, TiN, TaN, WN, TiAlN, TaAlN, W, Poly-Si, Al, TiSiN. Pt, Ir, Au, Ru or other suitable wire material to enhance conductivity of the TE 104.

Figure 2:
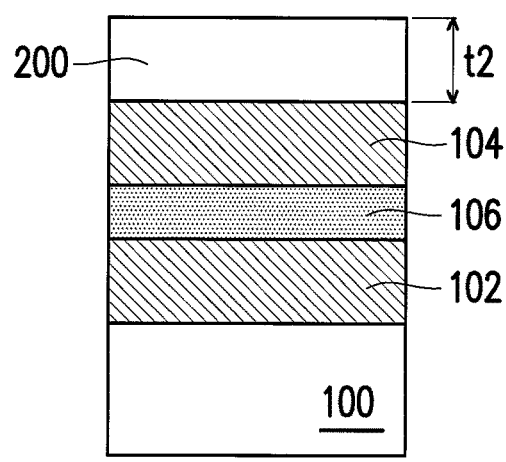
FIG. 2 is a sectional schematic view illustrating an RRAM according to a second embodiment of the invention.

FIG. 2 is a sectional schematic view illustrating an RRAM according to a second embodiment of the invention. Meanwhile, the embodiment adopts the same reference numbers as used in the first embodiment to refer to the same elements.

Referring to FIG. 2, the RRAM shown by the second embodiment further includes a TCO layer 200 apart from the TE 104, BE 102 and the TMO layer 106. The thickness t2 of the TCO layer 200 is, for example, from 0.5 nm to 250 nm, and preferably from 150 nm to 250 nm. Since the thickness t2 is 150 nm or more, the sheet resistance thereof may be lower than 50 Ω/sq. Since the thickness t2 is 250 nm or less, the light transmittance thereof may be 55% or more. The TCO layer 200 is apparently thicker than the TCO layer 110 shown by FIG. 1; therefore, the metal cap layer 108 shown by FIG. 1 may be omitted to reduce complexity of manufacturing process while retaining the characteristic of inhibiting oxygen ions diffusion and conductivity. Moreover, the entire TCO layer 200 is disposed above the TE 104 such that UV erase operation may be performed.

Figure 3:
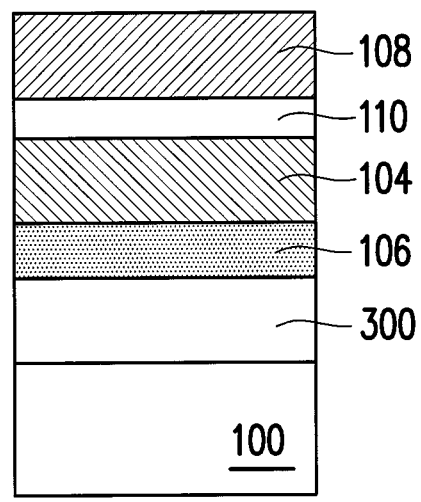
FIG. 3 is a sectional schematic view illustrating another form of the RRAM shown by the first embodiment.

FIG. 3 is a sectional schematic view illustrating another form of the RRAM shown by the first embodiment. In the meantime, the embodiment adopts the same reference numbers as used in the first embodiment to refer to the same elements.

In the RRAM shown by FIG. 3, a BE 300 is a TCO layer which may block oxygen ions diffusion in the TMO layer 106. Also, since the TCO layer has a flat film surface, it is employed as the BE 300 to solve the issue that the conductive path of TMO is affected caused by the rough surface of TiN when TiN is used as the material of the BE. The material of the BE 300 may be selected from, for example, ITO, IZO, IGZO, FTO, AZO or ICO. Meanwhile, the material of the TCO layer 110 and the BE 300 may be identical or different. When the material of the BE 300 is IZO, it may be formed by using reactive magnetron co-sputtering deposition. The degree of flatness of IZO film may reach 1.19 nm. When the material of the BE 300 is ITO, it may be formed by using negative ion sputtering deposition (<1 nm rms). Take ITO as an example, the condition for forming a film by using sputtering includes that the temperature of a substrate ranges from 25° C. to 250° C., a flow ratio of Ar/$O_2$ is 70-95/30-5. Meanwhile, a more flat film may be attained by reducing film-forming power or employing different film-forming process (e.g. adding ion source), such that the formation of TiN column-shaped structure or the like may be avoided, and the film roughness does not increase when the film has greater thickness.

Figure 4:
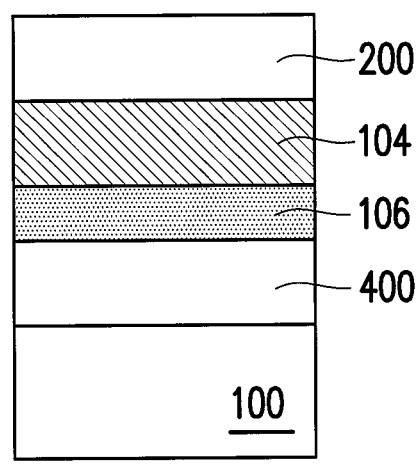
FIG. 4 is a sectional schematic view illustrating another form of the RRAM shown by the second embodiment.

FIG. 4 is a sectional schematic view illustrating another form of the RRAM shown by the second embodiment. In the meantime, the embodiment adopts the same reference numbers as used in the first embodiment to refer to the same elements.

In the RRAM shown by FIG. 4, a BE 400 is a TCO layer. The material of the BE 400 may be selected from, for example, ITO, IZO, IGZO, FTO, AZO or ICO. Meanwhile, the material of the TCO layer 200 and the BE 400 may be identical or different.

Figure 5:
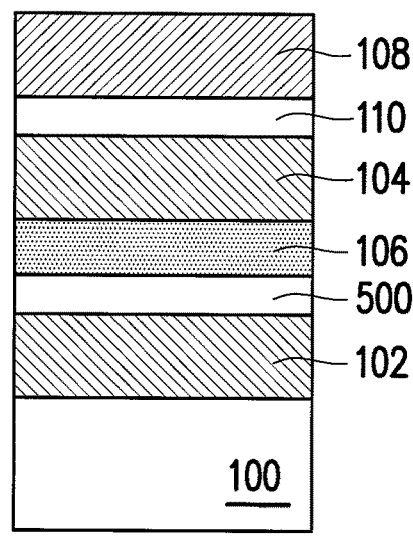
FIG. 5 is a sectional schematic view illustrating another form of the RRAM shown by the first embodiment.

FIG. 5 is a schematic view illustrating another form of the RRAM shown by the first embodiment. In the meantime, the embodiment adopts the same reference numbers as used in the first embodiment to refer to the same elements.

In FIG. 5, a TCO layer 500 is further disposed between the BE 102 and the TMO layer 106, and the material thereof may be selected from, for example, ITO, IZO, IGZO, FTO, AZO or ICO. Meanwhile, the material of the TCO layer 500 and the TCO layer 110 may be identical or different. The TCO layer 500 may inhibit oxygen ions diffusion while retaining conductivity.

Figure 6:
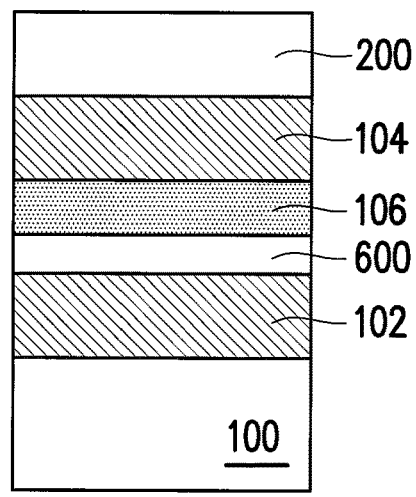
FIG. 6 is a sectional schematic view illustrating another form of the RRAM shown by the second embodiment.

FIG. 6 is a sectional schematic view illustrating another form of the RRAM shown by the second embodiment. In the meantime, the embodiment adopts the same reference numbers as used in the first embodiment to refer to the same elements.

In FIG. 6, a TCO layer 600 is further disposed between the BE 102 and the TMO layer 106, and the material thereof may be selected from, for example, ITO, IZO, IGZO, FTO, AZO or ICO. Meanwhile, the material of the TCO layer 600 and the TCO layer 200 may be identical or different. The TCO layer 600 may inhibit oxygen ions diffusion while retaining conductivity.

In summary, the invention disposes the TCO layer on the TE of the RRAM, which not only may inhibit oxygen ions diffusion but also ensure electrical conductance while blocking oxygen ions diffusion since the TCO layer has the characteristics of light transmittance and conductivity. In the meantime, the above technique may be employed in UV erase operation. Also, the material of the BE may use transparent conductive oxide, which may also block oxygen ions diffusion and achieve conduction property for electrode.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A resistive random access memory (RRAM), comprising a top electrode, a bottom electrode and a transition metal oxide layer between the top electrode and the bottom electrode, a material of the top electrode comprises metal or metal alloy, the RRAM further comprising:
   a first transparent conductive oxide layer disposed on the top electrode and directly contacting the top electrode, wherein a material of the first transparent conductive oxide layer is different from the material of the top electrode, and the first transparent conductive oxide layer and the transition metal oxide layer are disposed on opposite sides of the top electrode.

2. The RRAM according to claim 1, wherein a thickness of the first transparent conductive oxide layer is from 0.5 nm to 250 nm.

3. The RRAM according to claim 1, wherein the material of the first transparent conductive oxide layer comprises Indium-Tin Oxide (ITO), Indium-Zinc Oxide (IZO), Indium-Gallium-Zinc Oxide (IGZO), Fluorine-Tin Oxide (FTO), Aluminum-Zinc Oxide (AZO) or Indium-Calcium Oxide (ICO).

4. The RRAM according to claim 1, wherein a material of the bottom electrode comprises metal, alloy or a transparent conductive oxide.

5. The RRAM according to claim 1, further comprising a second transparent conductive oxide layer disposed between the bottom electrode and the transition metal oxide layer.

6. The RRAM according to claim 5, wherein a material of the second transparent conductive oxide layer comprises ITO, IZO, IGZO, FTO, AZO, or ICO.

7. The RRAM according to claim 1, further comprising a metal cap layer disposed on the first transparent conductive oxide layer.

8. The RRAM according to claim 7, wherein a thickness of the first transparent conductive oxide layer is from 0.5 nm to 50 nm.

\* \* \* \* \*